(12) United States Patent
Cheng et al.

(10) Patent No.: US 11,269,038 B2
(45) Date of Patent: Mar. 8, 2022

(54) HIGH INTEGRATED AND INTELLIGENT TX FRONT-END USED IN MRI SYSTEM

(71) Applicant: Siemens Healthcare GmbH, Erlangen (DE)

(72) Inventors: Hong Cheng, Shenzhen (CN); Zhi Bin Li, Shenzhen (CN); Wen Ming Li, Shenzhen (CN)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/089,883

(22) Filed: Nov. 5, 2020

(65) Prior Publication Data

US 2021/0132173 A1    May 6, 2021

(30) Foreign Application Priority Data

Nov. 6, 2019    (CN) .......................... 201911076020.6

(51) Int. Cl.
*G01R 33/58* (2006.01)
*G01R 33/36* (2006.01)
(52) U.S. Cl.
CPC ....... *G01R 33/583* (2013.01); *G01R 33/3614* (2013.01)

(58) Field of Classification Search
CPC .......................... G01R 33/583; G01R 33/3614
See application file for complete search history.

(56) References Cited

U.S. PATENT DOCUMENTS

| | | | |
|---|---|---|---|
| 7,474,877 B2 * | 1/2009 | Bielmeier | G01R 33/3614 455/114.3 |
| 2010/0167668 A1 * | 7/2010 | Nistler | G01R 33/48 455/101 |

* cited by examiner

*Primary Examiner* — G. M. A Hyder
(74) *Attorney, Agent, or Firm* — Schiff Hardin LLP

(57) ABSTRACT

In a device and method for monitoring an RF transmission circuit of an MRI device: a first power measurement signal is acquired that indicates a voltage of a first RF signal provided by an RF power amplifier of the RF transmission circuit; two second power measurement signals are received that each indicate a voltage of one second RF signal, the two second RF signals being generated based on the first RF signal by a bridge of the circuit and transmitted via an RF transmit coil; an inverse matrix calculation is performed based on the two second power measurement signals to obtain a voltage calculation value; the voltage calculation value is compared with the first power measurement signal; an operational status of the RF transmission circuit is determined based on a difference between the voltage calculation value and a voltage value of the first power measurement signal.

22 Claims, 6 Drawing Sheets

HIGH INTEGRATED AND INTELLIGENT TX FRONT-END USED IN MRI SYSTEM

CROSS REFERENCE TO RELATED APPLICATIONS

This patent application claims priority to Chinese Patent Application No. 201911076020.6, filed Nov. 6, 2019, which is incorporated herein by reference in its entirety.

BACKGROUND

Field

The present disclosure relates to the monitoring of RF transmission circuits of MRI apparatuses, in particular to a method and device for monitoring an RF transmission circuit of an MRI apparatus.

Related Art

A magnetic resonance imaging (MRI) apparatus is an apparatus which uses MR characteristics exhibited by magnetic nuclei (mainly hydrogen nuclei) of an organism in a magnetic field to perform imaging. With progress in superconducting technology, magnet technology, electronics technology, computer technology and materials science, MRI apparatuses have undergone rapid development. Generally, an MRI apparatus comprises a magnet system, a gradient system, a radio frequency (RF) system, a computer and data processing system, and an auxiliary apparatus part. Magnet systems commonly used at the present time include superconducting magnets and permanent magnets. The gradient system consists of a gradient amplifier and three sets of gradient coils (X, Y and Z), which are configured to alter a main magnetic field in order to generate a gradient magnetic field. The RF system consists of two main parts, specifically a transmitting part and a receiving part. The RF transmitting part is configured to transmit RF pulses, causing magnetized hydrogen protons to absorb energy and generate resonance. The RF receiving part receives resonance signals of hydrogen protons within an imaging region, and obtains an image of an internal structure of a patient's body by computer processing. Thus, the RF system is one of the most critical parts of an MRI apparatus.

An existing RF system can switch between an RF transmission path and an RF receiving path. The RF transmission path comprises an RF signal transmitter, an RF power amplifier (RFPA), a transmit antenna switch (TAS), a body coil channel selector (BCCS), a transmit antenna power monitor (TALES), an RF transmit coil, etc. As shown in FIG. 1, an initial RF signal generated by an RF signal transmitter 102 is amplified by an RF power amplifier 104 and then outputted to a transmit antenna switch 106. In an RF transmission mode, by receiving a control signal from a control module 108, the transmit antenna switch 106 establishes an electrical connection between the RF power amplifier 104 and the body coil channel selector 110. The amplified RF signal arrives at the body coil channel selector 110 via the transmit antenna switch 106. The body coil channel selector 110 splits the inputted RF signal into two RF signals with orthogonal phases via an internal bridge and outputs the two RF signals to a transmit antenna power monitor 112. The transmit antenna power monitor 112 is configured to monitor the power of the RF signals arriving at an RF transmit coil 114 via the transmit antenna power monitor. As further shown in FIG. 1, the RF transmit coil 114 is configured to transmit the RF signals to generate an RF magnetic field. In the RF transmission mode, a tuning/detuning dynamic controller 116 tunes a positive current supplied to the RF transmit coil. A tuning capacitor (body tuning box, BTB, not shown in FIG. 1) is integrated in the RF transmit coil and configured to tune a resonant frequency of the RF transmit coil to a system center frequency. In the case of 1.5 T and high-magnetic-field applications, this tuning capacitor may generally be constructed within the RF transmit coil, but in the case of low-magnetic-field applications, the capacitor tuning range is greatly increased because the frequency is much lower. It is not easy for a cost-effective capacitor with a sufficient range of values to be constructed in the RF transmit coil. In addition, when it is necessary to calibrate the initial RF signal, the transmit antenna switch 106 can, after receiving a control signal for performing calibration from the control module 108, switch to connection to a 50 ohm virtual load in order to perform RF characteristic calibration. Due to the requirements of a high-power switch, the price thereof is expensive.

These components in the RF transmission path are generally separate, and many cables are needed to connect these components together, resulting in complexity and a high cost. In addition, these components must be redesigned for different magnetic field applications, and RF characteristic calibration and RF signal transmission in the RF transmission path must be performed separately.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

Figure 1:
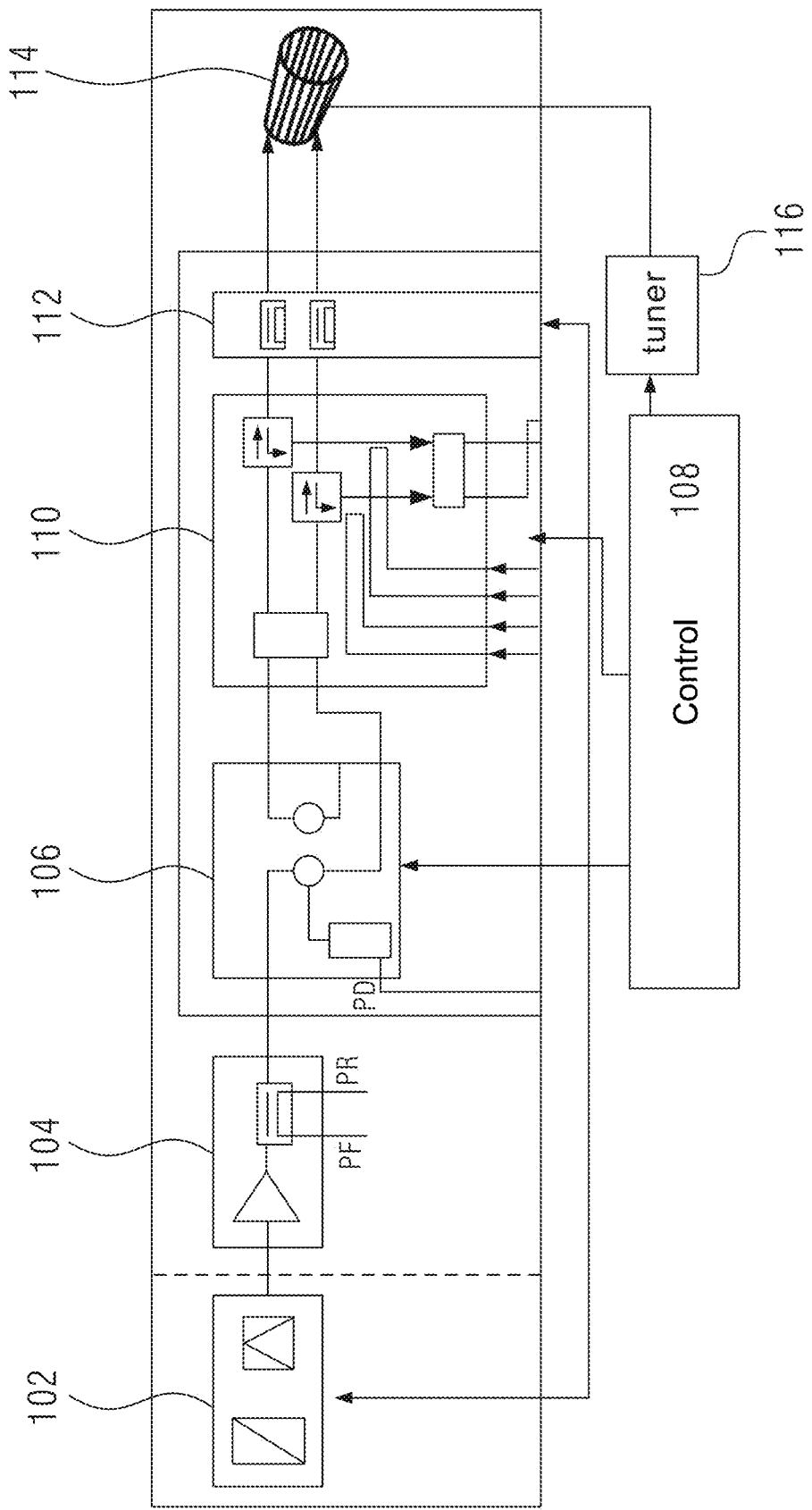
FIG. 1 is a schematic diagram of a conventional magnetic resonance imaging (MRI) apparatus.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure. The connections shown in the figures between functional units or other elements can also be implemented as indirect connections, wherein a connection can be wireless or wired. Functional units can be implemented as hardware, software or a combination of hardware and software.

The present disclosure provides an RF transmission control method and device for an MRI apparatus, to at least solve the problems of difficulty in performing troubleshooting, difficulty of maintenance, structural complexity and lack of intelligent functionality which affect an RF transmission device of an MRI apparatus in the prior art.

According to one aspect of embodiments of the present disclosure, a method for monitoring an RF transmission circuit of an MRI apparatus is provided, the method comprising: acquiring a first power measurement signal, the first power measurement signal indicating a voltage of a first RF signal, wherein the first RF signal is provided by an RF power amplifier of the RF transmission circuit; acquiring two second power measurement signals, each second power measurement signal indicating a voltage of a corresponding one of two second RF signals, wherein the two second RF signals are generated on the basis of the first RF signal by a bridge of the RF transmission circuit and configured to be transmitted via an RF transmit coil of the RF transmission circuit; performing inverse matrix calculation on the basis of the two second power measurement signals, to obtain a voltage calculation value as a calculation result; comparing the calculation result with the first power measurement signal; determining that the RF transmission circuit is normal if the difference between the calculation result and a voltage value of the first power measurement signal is within a preset threshold range, and determining that the RF transmission circuit is abnormal if the difference between the calculation result and the voltage value of the first power measurement signal exceeds the preset threshold range.

In this way, the power state of the RF transmission circuit is monitored in real time and power abnormality of the RF transmission circuit is ascertained during RF pulse transmission; the system can be shut down promptly when the power is abnormal, thereby ensuring the safety of a patient undergoing MR diagnosis.

In a schematic embodiment of the method for monitoring an RF transmission circuit of an MRI apparatus, the first RF signal is obtained through amplification of an initial RF signal by the RF power amplifier, and the method further comprises: using the two second power measurement signals to subject the initial RF signal to linearity calibration, to acquire a calibrated initial RF signal, and outputting the calibrated initial RF signal to replace the initial RF signal, such that the first RF signal outputted from the power amplifier is an RF signal meeting a linearity requirement.

In this way, there is no need for an additional switch component to perform an additional calibration operation; real-time linearity calibration of an RF signal characteristic is realized while monitoring the power state of the RF transmission circuit, thus simplifying the system architecture of the RF transmission circuit, increasing the convenience of operation and lowering costs.

In a schematic embodiment of the method for monitoring an RF transmission circuit of an MRI apparatus, the method further comprises: acquiring two third power measurement signals, each third power measurement signal indicating a measured value of a voltage of one of the second RF signals; comparing the second power measurement signal and the third power measurement signal for the second RF signal that is on the same transmission link and outputted from the bridge; if a voltage value of the third power measurement signal is the same as the voltage value of the second power measurement signal, determining that the RF transmission circuit is normal, and if the voltage value of the third power measurement signal is not the same as the voltage value of the second power measurement signal, determining that the RF transmission circuit is abnormal.

In this way, by providing the third power measurement modules to perform redundant measurement of the power of the RF transmission circuit, the accuracy of power monitoring of the RF transmission circuit is increased.

In a schematic embodiment of the method for monitoring an RF transmission circuit of an MRI apparatus, the step of performing inverse matrix calculation on the basis of the two second power measurement signals comprises: acquiring a voltage value and a phase value indicated by each of the two second power measurement signals, and using the voltage values and phase values acquired from the two second power measurement signals to perform inverse matrix calculation.

In this way, the measured voltage values and phase values of the second RF signals are used to realize inverse matrix calculation, and it is possible to obtain a voltage calculation value and phase calculation value of the first RF signal, and thereby possible to compare the voltage calculation value and a voltage measurement value of the first RF signal.

In a schematic embodiment of the method for monitoring an RF transmission circuit of an MRI apparatus, the method further comprises: acquiring a switch state indication signal, the switch state indication signal being a logic level signal and indicating whether a mode switching switch of the RF transmission circuit is in an ON state or an OFF state, wherein the mode switching switch is in the ON state or OFF state according to a received switch instruction; determining that the mode switching switch is operating normally if the states indicated by the acquired switch state indication signal and the switch instruction are the same, and determining that the mode switching switch is operating abnormally if the states indicated by the acquired switch state indication signal and the switch instruction are not the same.

In this way, real-time monitoring of the operating state of the mode switching switch is realized, thereby realizing real-time fault diagnosis for the mode switching switch.

In a schematic embodiment of the method for monitoring an RF transmission circuit of an MRI apparatus, the method further comprises: acquiring a state feedback signal, the state feedback signal being a logic level signal and indicating whether a tuned positive current or reverse voltage supplied to an RF transmit coil by a tuning/detuning dynamic controller of the RF transmission circuit is within a designated threshold range, wherein the tuning/detuning dynamic controller tunes the positive current or reverse voltage supplied to the RF transmit coil according to a received control signal; determining that the tuning/detuning dynamic controller is operating normally if the acquired state feedback signal indicates that the tuned positive current or reverse voltage supplied by the tuning/detuning dynamic controller is within the designated threshold range, and determining that the tuning/detuning dynamic controller is operating abnormally if the acquired state feedback signal indicates that the tuned positive current or reverse voltage supplied by the tuning/detuning dynamic controller is not within the designated threshold range.

In this way, real-time monitoring of the operating state of the tuning/detuning dynamic controller of the RF transmission circuit is realized, thereby realizing real-time fault diagnosis for the tuning/detuning dynamic controller.

In a schematic embodiment of the method for monitoring an RF transmission circuit of an MRI apparatus, the method further comprises: acquiring a temperature detection signal, the temperature detection signal being a logic level signal and indicating whether a temperature value at a specific position in the RF transmission circuit exceeds a preset temperature threshold; determining that the temperature at the specific position is normal if the acquired temperature detection signal indicates that the preset temperature threshold is not exceeded, and determining that the temperature at the specific position is abnormal if the acquired temperature detection signal indicates that the preset temperature threshold is exceeded.

In this way, real-time monitoring of temperature at the specific position in the RF transmission circuit is realized, thereby realizing real-time fault diagnosis for temperature at the specific position.

In a schematic embodiment of the method for monitoring an RF transmission circuit of an MRI apparatus, the method further comprises: acquiring a voltage detection signal, the voltage detection signal being a logic level signal and indicating whether a power supply voltage of the RF transmission circuit exceeds a preset voltage threshold; determining that the power supply voltage of the RF transmission circuit is normal if the acquired voltage detection signal indicates that the preset voltage threshold is not exceeded, and determining that the power supply voltage of the RF transmission circuit is abnormal if the acquired voltage detection signal indicates that the preset voltage threshold is exceeded.

In this way, real-time monitoring of the power supply voltage of the RF transmission circuit is realized, thereby realizing real-time fault diagnosis for the power supply voltage.

According to another aspect of embodiments of the present disclosure, a device for monitoring an RF transmission circuit of an MRI apparatus is further provided, the device comprising: a first power measurement module, for measuring a voltage of a first RF signal and outputting a first power measurement signal, wherein the first power measurement module is connected between an output end of an RF power amplifier of the RF transmission circuit and an input end of a bridge of the RF transmission circuit, the RF power amplifier being configured to provide the first RF signal, and the bridge being configured to generate, on the basis of the first RF signal, two second RF signals for transmission via an RF transmit coil of the RF transmission circuit; two second power measurement modules, each measuring a voltage of a corresponding one of the two second RF signals and outputting a second power measurement signal, wherein the two second power measurement modules are respectively connected in two transmission links between the RF transmit coil and two output ends of the bridge; and a transmitting and calculating module, connected to the first power measurement module and the two second power measurement modules and configured to: acquire the first power measurement signal and the two second power measurement signals outputted from the two second power measurement modules, perform inverse matrix calculation on the basis of the two second power measurement signals to obtain a voltage calculation value as a calculation result, compare the calculation result with the first power measurement signal, determine that the RF transmission circuit is normal if the difference between the calculation result and a voltage value of the first power measurement signal is within a preset threshold range, and determine that the RF transmission circuit is abnormal if the difference between the calculation result and the voltage value of the first power measurement signal exceeds the preset threshold range.

In this way, the power state of the RF transmission circuit is monitored in real time and power abnormality of the RF transmission circuit is ascertained during RF pulse transmission; the system can be shut down promptly when the power is abnormal, thereby ensuring the safety of a patient undergoing MR diagnosis.

In a schematic embodiment of the device for monitoring an RF transmission circuit of an MRI apparatus, the first RF signal is obtained through amplification of an initial RF signal by the RF power amplifier, and the transmitting and calculating module is further configured to: use the two second power measurement signals to subject the initial RF signal to linearity calibration, to acquire a calibrated initial RF signal, and output the calibrated initial RF signal to replace the initial RF signal, such that the first RF signal outputted from the power amplifier is an RF signal meeting a linearity requirement.

In this way, there is no need for an additional switch component to perform an additional calibration operation; real-time linearity calibration of an RF signal characteristic is realized while monitoring the power state of the RF transmission circuit, thus simplifying the system architecture of the RF transmission circuit, increasing the convenience of operation and lowering costs.

In a schematic embodiment of the device for monitoring an RF transmission circuit of an MRI apparatus, the device further comprises: two third power measurement modules, each measuring a value of a voltage of one of the second RF signals at the third power measurement module and outputting a third power measurement signal, wherein each third power measurement module is further connected between an output end of one of the second power measurement modules and the RF transmit coil. Moreover, the transmitting and calculating module is further configured to: acquire the two third power measurement signals, and compare the second power measurement signal and the third power measurement signal for the second RF signal that is on the same transmission link and outputted from the bridge; determine that the RF transmission circuit is normal if a voltage value of the third power measurement signal is the same as a voltage value of the second power measurement signal, and determine that the RF transmission circuit is abnormal if the voltage value of the third power measurement signal is not the same as the voltage value of the second power measurement signal.

In this way, by providing the third power measurement modules to perform redundant measurement of the power of the RF transmission circuit, the accuracy of power monitoring of the RF transmission circuit is increased.

In a schematic embodiment of the device for monitoring an RF transmission circuit of an MRI apparatus, the step of performing inverse matrix calculation on the basis of the two second power measurement signals comprises: acquiring a voltage value and a phase value indicated by each of the two second power measurement signals, and using the voltage values and phase values acquired from the two second power measurement signals to perform inverse matrix calculation.

In this way, the measured voltage values and phase values of the second RF signals are used to realize inverse matrix calculation, and it is possible to obtain a voltage calculation value and phase calculation value of the first RF signal, and thereby possible to compare the voltage calculation value and a voltage measurement value of the first RF signal.

In a schematic embodiment of the device for monitoring an RF transmission circuit of an MRI apparatus, the device further comprises: a logic determining module connected to two mode switching switches of the RF transmission circuit, each mode switching switch being further connected between one output end of the bridge and an input end of one of the second power measurement modules and being in an ON state or OFF state according to a received switch instruction. The logic determining module is configured to: acquire a switch state indication signal, the switch state indication signal being a logic level signal and indicating whether the mode switching switch is in the ON state or OFF state, determine that the mode switching switch is operating normally if the states indicated by the acquired switch state indication signal and the switch instruction are the same, and determine that the mode switching switch is operating abnormally if the states indicated by the acquired switch state indication signal and the switch instruction are not the same.

In this way, real-time monitoring of the operating state of the mode switching switch is realized, thereby realizing real-time fault diagnosis for the mode switching switch.

In a schematic embodiment of the device for monitoring an RF transmission circuit of an MRI apparatus, the logic determining module is further configured to: acquire a state feedback signal, the state feedback signal being a logic level signal and indicating whether a tuned positive current or reverse voltage supplied to the RF transmit coil by a tuning/detuning dynamic controller of the RF transmission circuit is within a designated threshold range, wherein the tuning/detuning dynamic controller tunes the positive current or reverse voltage supplied to the RF transmit coil according to a control signal received from the transmitting and calculating module; determine that the tuning/detuning dynamic controller is operating normally if the acquired state feedback signal indicates that the tuned positive current or reverse voltage supplied by the tuning/detuning dynamic controller is within the designated threshold range, and determine that the tuning/detuning dynamic controller is operating abnormally if the acquired state feedback signal indicates that the tuned positive current or reverse voltage supplied by the tuning/detuning dynamic controller is not within the designated threshold range.

In this way, real-time monitoring of the operating state of the tuning/detuning dynamic controller of the RF transmission circuit is realized, thereby realizing real-time fault diagnosis for the tuning/detuning dynamic controller.

In a schematic embodiment of the device for monitoring an RF transmission circuit of an MRI apparatus, the device further comprises: a temperature sensor, for measuring a temperature at a specific position in the RF transmission circuit. Moreover, the logic determining module is further configured to: acquire a temperature detection signal, the temperature detection signal being a logic level signal and indicating whether a temperature value measured by the temperature sensor exceeds a preset temperature threshold; determine that the temperature at the specific position is normal if the acquired temperature detection signal indicates that the preset temperature threshold is not exceeded, and determine that the temperature at the specific position is abnormal if the acquired temperature detection signal indicates that the preset temperature threshold is exceeded.

In this way, real-time monitoring of temperature at the specific position in the RF transmission circuit is realized, thereby realizing real-time fault diagnosis for temperature at the specific position.

In a schematic embodiment of the device for monitoring an RF transmission circuit of an MRI apparatus, the device further comprises: a voltage sensor, for measuring a power supply voltage of the RF transmission circuit. Moreover, the logic determining module is further configured to: acquire a voltage detection signal, the voltage detection signal being a logic level signal and indicating whether a power supply voltage of the RF transmission circuit measured by the voltage sensor exceeds a preset voltage threshold; determine that the power supply voltage of the RF transmission circuit is normal if the acquired voltage detection signal indicates that the preset voltage threshold is not exceeded, and determine that the power supply voltage of the RF transmission circuit is abnormal if the acquired voltage detection signal indicates that the preset voltage threshold is exceeded.

In this way, real-time monitoring of the power supply voltage of the RF transmission circuit is realized, thereby realizing real-time fault diagnosis for the power supply voltage.

In a schematic embodiment of the device for monitoring an RF transmission circuit of an MRI apparatus, the first power measurement module, the bridge, the two mode switching switches, the two second power measurement modules, the logic determining module and the tuning/detuning dynamic controller are mounted in an integrated fashion on a single removable circuit board.

In this way, the components of the RF transmission circuit are integrated with the components of the device for monitoring the RF transmission circuit, making the structure more compact. Furthermore, in conjunction with fault diagnosis, troubleshooting can be realized in a simple and convenient manner by replacing the removable circuit board directly after fault diagnosis.

According to another aspect of embodiments of the present disclosure, an RF transmission device of an MRI apparatus is also provided, comprising: the abovementioned device for monitoring an RF transmission circuit of an MRI apparatus; and an RF transmission circuit, comprising an RF power amplifier, a bridge, two mode switching switches and an RF transmit coil, wherein the bridge is connected between an output end of the RF power amplifier and input ends of the two mode switching switches, and output ends of the two mode switching switches are connected to the RF transmit coil.

In this way, when the device for monitoring an RF transmission circuit of an MRI apparatus is applied in an MR apparatus, it is possible to realize real-time linearity calibration of an RF signal characteristic while monitoring the power state of the RF transmission circuit, and also realize RF transmission circuit fault diagnosis and troubleshooting.

The present disclosure employs the technical solution of acquiring power measurement signals of an RF transmission circuit and comparing these to determine the power state of the RF transmission circuit while using the measurement signals to subject an RF signal characteristic to real-time linearity calibration, thereby solving the technical problems of patient risk caused by inability to monitor the power state of the RF transmission circuit, high cost caused by the provision of a service switch for RF characteristic calibration, and operational complexity caused by performing RF characteristic calibration and RF signal transmission separately, thus achieving the technical effects of reducing patient risk, simplifying the system architecture of the RF transmission circuit, reducing costs and increasing convenience of operation.

Figure 2:
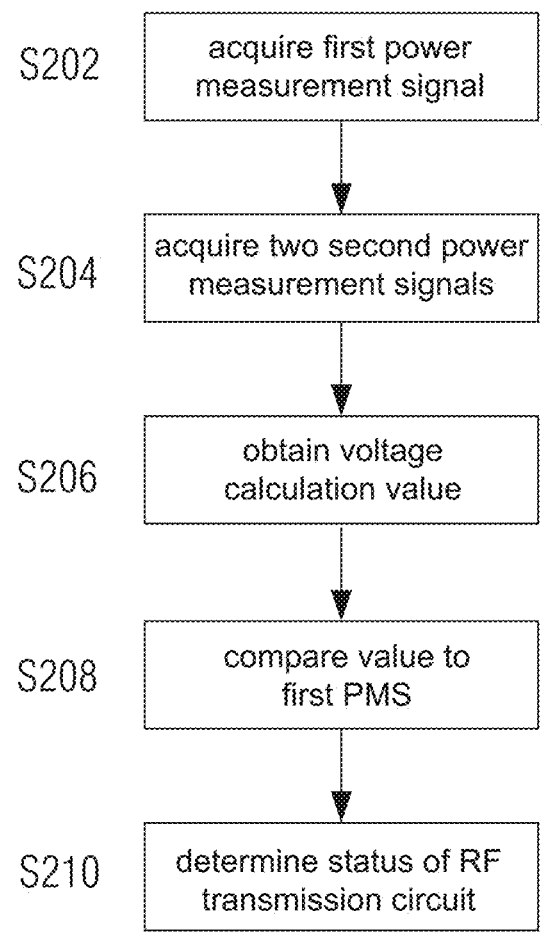
FIG. 2 is a flow chart of a method for monitoring an RF transmission circuit of an MRI apparatus according to an exemplary embodiment of the present disclosure.

According to an embodiment of the present disclosure, a method for monitoring an RF transmission circuit of an MRI apparatus is provided. FIG. 2 is a flow chart of an RF transmission control method for an MRI apparatus according to an embodiment of the present disclosure. Referring to FIG. 2, according to an embodiment of the present disclosure, a method for monitoring an RF transmission circuit of an MRI apparatus comprises:

S202, acquiring a first power measurement signal, the first power measurement signal indicating a voltage of a first RF signal, wherein the first RF signal is provided by an RF power amplifier of the RF transmission circuit;

S204, acquiring two second power measurement signals, each second power measurement signal indicating a voltage of a corresponding one of two second RF signals, wherein the two second RF signals are generated on the basis of the first RF signal by a bridge of the RF transmission circuit and configured to be transmitted via an RF transmit coil of the RF transmission circuit;

S206, performing inverse matrix calculation on the basis of the two second power measurement signals, to obtain a voltage calculation value as a calculation result;

S208, comparing the calculation result with the first power measurement signal;

S210, determining that the RF transmission circuit is normal if the difference between the calculation result and a voltage value of the first power measurement signal is within a preset threshold range, and determining that the RF transmission circuit is abnormal if the difference between the calculation result and the voltage value of the first power measurement signal exceeds the preset threshold range.

In this embodiment, the first power measurement signal is acquired by a transmitting and calculating module of the RF transmission circuit. The transmitting and calculating module is connected to a first power measurement module; the first power measurement module measures the voltage and phase of the first RF signal outputted from the RF power amplifier, and outputs same as the first power measurement signal. The transmitting and calculating module receives the first power measurement signal from the first power measurement module.

In this embodiment, the two second power measurement signals are acquired by the transmitting and calculating module of the RF transmission circuit. The bridge receives the first RF signal by means of the first power measurement module and generates the two second RF signals. The phases of the two second RF signals are orthogonal to each other. Each of two second power measurement modules measures the voltage and phase of one second RF signal outputted from the bridge, and outputs same as the corresponding second power measurement signal. The transmitting and calculating module receives the two second power measurement signals from the two second power measurement modules respectively.

In this embodiment, the transmitting and calculating module performs inverse matrix calculation on the basis of the two acquired second power measurement signals, to obtain a voltage calculation value for the first RF signal as a calculation result. By comparing the voltage calculation value with a voltage measurement value of the first RF signal indicated by the first power measurement signal, it is possible to determine whether the power of the RF transmission circuit is abnormal. When the difference between the two values is within the preset threshold range, it is determined that the power of the RF transmission circuit is normal, otherwise it is determined that the power of the RF transmission circuit is abnormal. The preset threshold range is set in advance by operating personnel, and for example is ±5%, ±10% or ±20%, etc. of the voltage measurement value of the first RF signal.

In this way, the power state of the RF transmission circuit is monitored in real time and power abnormality of the RF transmission circuit is ascertained; the system can be shut down promptly when the power is abnormal, thereby ensuring the safety of the patient undergoing MR diagnosis.

Furthermore, in this embodiment, the step of performing inverse matrix calculation on the basis of the two second power measurement signals comprises: acquiring a voltage value and a phase value indicated by each of the two second power measurement signals, and using the voltage values and phase values acquired from the two second power measurement signals to perform inverse matrix calculation.

The second power measurement signals indicate the measured voltage values and phase values of the second RF signals. The acquired voltage values and phase values relating to the two second RF signals are used to perform inverse matrix calculation, to obtain a voltage calculation value and a phase calculation value for the first RF signal as a calculation result.

In this way, the measured voltage values and phase values of the two second RF signals enable inverse matrix calculation to be realized, and it is thereby possible to obtain the voltage calculation value and phase calculation value for the first RF signal, and in turn possible to compare the voltage calculation value and voltage measurement value of the first RF signal.

Figure 3:
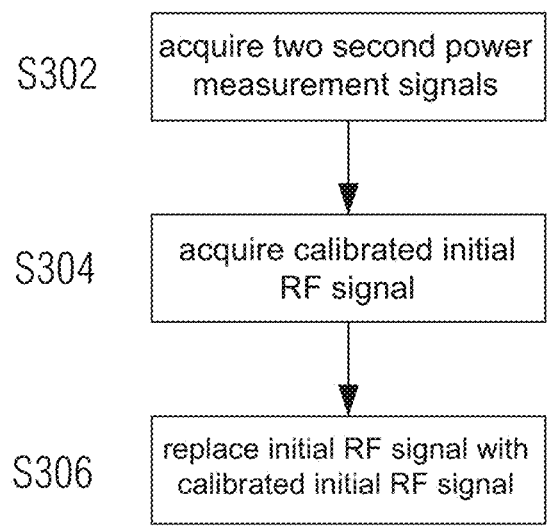
FIG. 3 is a flow chart of a method for monitoring an RF transmission circuit of an MRI apparatus according to an exemplary embodiment of the present disclosure.

FIG. 3 is a flow chart of a method for monitoring an RF transmission circuit of an MRI apparatus according to an exemplary embodiment of the present disclosure. Referring to FIG. 3, a method for monitoring an RF transmission circuit of an MRI apparatus according to an exemplary embodiment of the present disclosure comprises:

S302, acquiring two second power measurement signals;
S304, using the two second power measurement signals to subject an initial RF signal to linearity calibration, to acquire a calibrated initial RF signal;
S306, outputting the calibrated initial RF signal to replace the initial RF signal.

In this embodiment, step S302 of acquiring the second power measurement signals is the same as step S204 in FIG. 2. The initial RF signal is transmitted by a transmitting and calculating module of an RF transmission circuit. An RF power amplifier amplifies the initial RF signal and then outputs same as a first RF signal. A bridge receives the first RF signal and outputs two second RF signals. Each of two second power measurement modules measures the voltage and phase of one second RF signal, and outputs the corresponding second power measurement signal. The transmitting and calculating module receives the two second power measurement signals outputted from the two second power measurement modules and uses these two signals to subject the initial RF signal to linearity calibration, replacing the initial RF signal to output the linearity-calibrated initial RF signal, such that the first RF signal outputted from the power amplifier is an RF signal meeting a linearity requirement.

In this way, real-time linearity calibration of an RF signal characteristic is realized. Moreover, there is no need for an additional component to separately perform an RF signal calibration operation; the initial RF signal can be subjected to linearity calibration at the same time as the power state of the RF transmission circuit is being monitored.

The embodiment above may further comprise the following steps: acquiring two third power measurement signals, each third power measurement signal indicating a measured value of a voltage of one second RF signal; comparing the second power measurement signal and the third power measurement signal for the second RF signal that is on the same transmission link and outputted from the bridge; if a voltage value of the third power measurement signal is the same as the voltage value of the second power measurement signal, determining that the RF transmission circuit is normal, and if the voltage value of the third power measurement signal is not the same as the voltage value of the second power measurement signal, determining that the RF transmission circuit is abnormal.

In the embodiment comprising the above steps, the third power measurement signals are measured by third power measurement modules connected to output ends of the second power measurement modules. Each of the two third power measurement modules measures a voltage value of the second RF signal passing through the corresponding second power measurement module, and outputs same as the third power measurement signal. Due to the connection relationship between the second power measurement module and third power measurement module, in a normal operating state of the RF transmission circuit, the voltage value indicated by the second power measurement signal and the voltage value indicated by the third power measurement signal for the second RF signal that is on the same transmission link and outputted from the bridge should be the same. By comparing the voltage values of these two signals, it is possible to further determine whether the power state of the RF transmission circuit is abnormal.

In this way, by additionally providing the two third power measurement modules to perform redundant measurement of the power of the RF transmission circuit, the accuracy of power monitoring of the RF transmission circuit can be increased.

The method shown in FIG. 2 or FIG. 3 may further comprise the following steps: acquiring a switch state indication signal, the switch state indication signal being a logic level signal and indicating whether a mode switching switch of the RF transmission circuit is in an ON state or an OFF state, wherein the mode switching switch is in the ON state or OFF state according to a received switch instruction; if the states indicated by the acquired switch state indication signal and the switch instruction are the same, then determining that the mode switching switch is operating normally, and if the states indicated by the acquired switch state indication signal and the switch instruction are not the same, then determining that the mode switching switch is operating abnormally.

In the embodiment comprising the above steps, the mode switching switch is connected between the bridge and the second power measurement module and configured to be in an RF transmission mode or RF receiving mode according to the switch instruction from the transmitting and calculating module. In the RF transmission mode, the RF transmission circuit transmits an RF pulse signal to generate an RF magnetic field, and an RF receiving circuit does not operate. At this time, the mode switching switch is in the ON state, such that the second RF signal outputted from the bridge arrives at the second power measurement module via the mode switching switch. In the RF receiving mode, the RF transmission circuit does not operate, and the RF receiving circuit receives a resonance signal transmitted from the patient's body. At this time, the mode switching switch is in the OFF state such that the RF transmission circuit is OFF, but the received resonance signal can arrive at a receiver of the RF receiving circuit via another branch inside the mode switching switch.

The mode switching switch continuously outputs the switch state indication signal, the switch state indication signal being a logic level signal having a HIGH level or LOW level, wherein the HIGH level indicates that the switch is in the ON state and the LOW level indicates that the switch is in the OFF state, or the HIGH level indicates that the switch is in the OFF state and the LOW level indicates that the switch is in the ON state. By acquiring the switch state indication signal, it is possible to ascertain the ON/OFF state of the mode switching switch, and thereby possible to determine whether the operating state of the mode switching switch of the RF transmission circuit is abnormal.

Specifically, if the switch state indication signal and the switch instruction both indicate an ON state, then it is determined that the mode switching switch of the RF transmission circuit is operating normally. At this time, the switch instruction indicates the RF transmission mode, and the mode switching switch is in the RF transmission mode.

Specifically, if the switch instruction indicates an ON state but the switch state indication signal indicates an OFF state, then it is determined that the mode switching switch of the RF transmission circuit is operating abnormally. At this time, the switch instruction indicates the RF transmission mode, but the mode switching switch has not been able to successfully switch to the RF transmission mode.

Specifically, if the switch state indication signal and the switch instruction both indicate an OFF state, then it is determined that the mode switching switch of the RF transmission circuit is operating normally. At this time, the switch instruction indicates the RF receiving mode, and the mode switching switch is in the RF receiving mode.

Specifically, if the switch instruction indicates an OFF state but the switch state indication signal indicates an ON state, then it is determined that the mode switching switch of the RF transmission circuit is operating abnormally. At this time, the switch instruction indicates the RF receiving mode, but the mode switching switch has not been able to successfully switch to the RF receiving mode.

In this way, real-time monitoring of the operating state of the mode switching switch of the RF transmission circuit and real-time monitoring of the operating state of the mode switching switch of the RF receiving circuit are realized, and it is also possible to monitor whether mode switching of the mode switching switch is successful, thereby realizing real-time fault diagnosis for the mode switching switch.

The method shown in FIG. 2 or FIG. 3 may further comprise the following steps: acquiring a state feedback signal, the state feedback signal being a logic level signal and indicating whether a tuned positive current or reverse voltage supplied to an RF transmit coil by a tuning/detuning dynamic controller of the RF transmission circuit is within a designated threshold range, wherein the tuning/detuning dynamic controller tunes the positive current or reverse voltage supplied to the RF transmit coil according to a received control signal; if the acquired state feedback signal indicates that the tuned positive current or reverse voltage supplied by the tuning/detuning dynamic controller is within the designated threshold range, then it is determined that the tuning/detuning dynamic controller is operating normally, and if the acquired state feedback signal indicates that the tuned positive current or reverse voltage supplied by the tuning/detuning dynamic controller is not within the designated threshold range, then it is determined that the tuning/detuning dynamic controller is operating abnormally.

In the embodiment comprising the above steps, the designated threshold range is set in advance by operating personnel. For example, the designated threshold range for the positive current may be set to be 4.75 A±250 mA or a range of ±5% of 4.75 A. For example, the designated threshold range for the reverse voltage may be set to be a range of ±5% of −12 V.

In the embodiment comprising the above steps, the tuning/detuning dynamic controller tunes the positive current or reverse voltage sent to the RF transmit coil according to a control signal from the transmitting and calculating module. When the control signal indicates the RF transmission mode, the tuning/detuning dynamic controller tunes the positive current supplied to the RF transmit coil according to the received control signal, at which time the RF transmit coil is configured to transmit an RF signal so as to generate an RF magnetic field applied to the patient's body. When the control signal indicates the RF receiving mode and the RF transmit coil acts as a receive coil, the tuning/detuning dynamic controller tunes the positive current supplied to the RF transmit coil according to the received control signal, at which time the RF transmission circuit is OFF, and the RF transmit coil as the receive coil receives a resonance signal transmitted from the patient's body; when the control signal indicates the RF receiving mode and the RF transmit coil does not act as a receive coil, the tuning/detuning dynamic controller tunes the reverse voltage supplied to the RF transmit coil according to the received control signal, at which time the RF transmit coil does not operate.

In the embodiment comprising the above steps, the state feedback signal is a logic level signal having a HIGH level or a LOW level, wherein the HIGH level indicates that the tuned positive current or reverse voltage supplied by the tuning/detuning dynamic controller is within the designated threshold range and the LOW level indicates that the tuned positive current or reverse voltage supplied by the tuning/detuning dynamic controller exceeds the designated threshold range, or the HIGH level indicates that the tuned positive current or reverse voltage supplied by the tuning/detuning dynamic controller exceeds the designated threshold range and the LOW level indicates that the tuned positive current or reverse voltage supplied by the tuning/detuning dynamic controller is within the designated threshold range. Thus, by acquiring the state feedback signal sent by the tuning/detuning dynamic controller, it is possible to determine whether the positive current or reverse voltage supplied to the RF transmit coil is abnormal, and thereby determine whether the tuning/detuning dynamic controller in the RF transmission circuit is operating abnormally.

In this way, real-time monitoring of the operating state of the tuning/detuning dynamic controller of the RF transmission circuit is realized, thereby realizing real-time fault diagnosis for the tuning/detuning dynamic controller.

The method shown in FIG. 2 or FIG. 3 may further comprise the following steps: acquiring a temperature detection signal, the temperature detection signal being a logic level signal and indicating whether a temperature value at a specific position in the RF transmission circuit exceeds a preset temperature threshold; if the acquired temperature detection signal indicates that the preset temperature threshold is not exceeded, then it is determined that the temperature at the specific position is normal, and if the acquired temperature detection signal indicates that the preset temperature threshold is exceeded, then it is determined that the temperature at the specific position is abnormal.

In the embodiment comprising the above steps, the temperature detection signal is a logic level signal having a HIGH level or a LOW level, wherein the HIGH level indicates that the temperature has not exceeded the preset temperature threshold and the LOW level indicates that the temperature has exceeded the preset temperature threshold, or the HIGH level indicates that the temperature has exceeded the preset temperature threshold and the LOW level indicates that the temperature has not exceeded the preset temperature threshold. The preset temperature threshold is set in advance by operating personnel, and is for example 60° C. By acquiring the temperature detection signal, it is possible to determine whether the temperature value at the specific position in the RF transmission circuit has exceeded the preset temperature threshold. Preferably, the specific position is a position in the RF transmission circuit where power consumption is high and heating readily occurs. The specific position may be one or more positions, and correspondingly, the temperature detection signal may be one or more signals.

In this way, real-time monitoring of temperature at the specific position in the RF transmission circuit is realized, thereby realizing real-time fault diagnosis for temperature at the specific position.

The method shown in FIG. 2 or FIG. 3 may further comprise the following steps: acquiring a voltage detection signal, the voltage detection signal being a logic level signal and indicating whether a power supply voltage of the RF transmission circuit exceeds a preset voltage threshold; if the acquired voltage detection signal indicates that the preset voltage threshold is not exceeded, then it is determined that the power supply voltage of the RF transmission circuit is normal, and if the acquired voltage detection signal indicates that the preset voltage threshold is exceeded, then it is determined that the power supply voltage of the RF transmission circuit is abnormal.

In the embodiment comprising the above steps, the voltage detection signal is a logic level signal having a HIGH level or a LOW level, wherein the HIGH level indicates that the power supply voltage of the RF transmission circuit has not exceeded the preset voltage threshold and the LOW level indicates that the power supply voltage of the RF transmission circuit has exceeded the preset voltage threshold, or the HIGH level indicates that the power supply voltage of the RF transmission circuit has exceeded the preset voltage threshold and the LOW level indicates that the power supply voltage of the RF transmission circuit has not exceeded the preset voltage threshold. The preset voltage threshold is a power supply voltage value that is set in advance by operating personnel and supplied to a component of the RF transmission circuit. When multiple different power supply voltages are supplied to multiple components of the RF transmission circuit, multiple different preset voltage thresholds are correspondingly set, and multiple voltage detection signals are acquired. By acquiring the voltage detection signal, it is possible to determine whether the power supply voltage supplied to the component of the RF transmission circuit is abnormal.

In this way, real-time monitoring of the power supply voltage of the RF transmission circuit is realized, thereby realizing real-time fault diagnosis for the power supply voltage.

Figure 4:
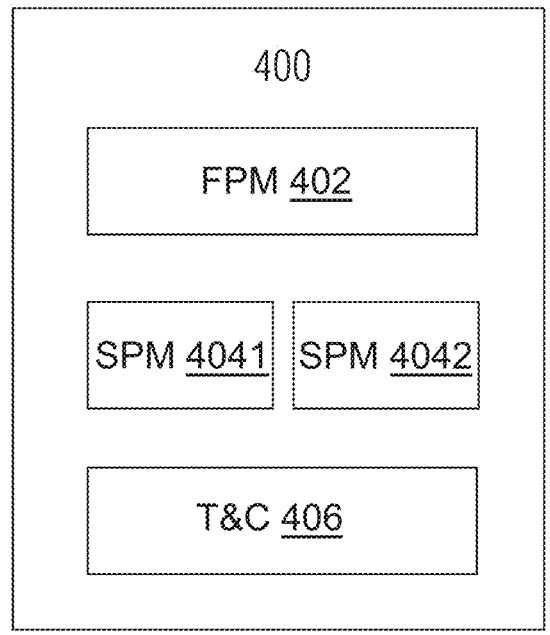
FIG. 4 is a block diagram of a device for monitoring an RF transmission circuit of an MRI apparatus according to an exemplary embodiment of the present disclosure.

According to an embodiment of the present disclosure, a device for monitoring an RF transmission circuit of an MRI apparatus is provided. FIG. 4 is a block diagram of a device for monitoring an RF transmission circuit of an MRI apparatus according to an embodiment of the present disclosure. Referring to FIG. 4, a device 400 for monitoring an RF transmission circuit of an MRI apparatus according to an embodiment of the present disclosure comprises:

a first power measurement module (first power measurement sensor) 402, for measuring a voltage of a first RF signal and outputting a first power measurement signal, wherein the first power measurement module 402 is connected between an output end of an RF power amplifier of the RF transmission circuit and an input end of a bridge of the RF transmission circuit, the RF power amplifier being configured to provide the first RF signal, and the bridge being configured to generate, on the basis of the first RF signal, two second RF signals for transmission via an RF transmit coil of the RF transmission circuit;

two second power measurement modules (second power measurement sensors) 4041 and 4042, each measuring a voltage of a corresponding one of the two second RF signals and outputting a second power measurement signal, wherein the two second power measurement modules 4041 and 4042 are respectively connected in two transmission links between the RF transmit coil and two output ends of the bridge; and a transmitting and calculating module (processor) 406, connected to the first power measurement module 402 and the two second power measurement modules 4041 and 4042 and configured to: acquire the first power measurement signal and the two second power measurement signals outputted from the two second power measurement modules 4041 and 4042, perform inverse matrix calculation on the basis of the two second power measurement signals to obtain a voltage calculation value as a calculation result, compare the calculation result with the first power measurement signal, determine that the RF transmission circuit is normal if the difference between the calculation result and a voltage value of the first power measurement signal is within a preset threshold range, and determine that the RF transmission circuit is abnormal if the difference between the calculation result and the voltage value of the first power measurement signal exceeds the preset threshold range.

A method realized by the device for monitoring an RF transmission circuit of an MRI apparatus according to an embodiment of the present disclosure is the same as the method described with reference to FIG. 2, so is not described again here.

In this embodiment, the first RF signal is obtained through amplification of an initial RF signal by the RF power amplifier. The transmitting and calculating module 406 is further configured to: transmit the initial RF signal to the RF power amplifier, use the two second power measurement signals to subject the initial RF signal to linearity calibration to acquire a linearity-calibrated initial RF signal, and output the calibrated initial RF signal to replace the initial RF signal.

A method realized by the device for monitoring an RF transmission circuit of an MRI apparatus according to the above embodiment is the same as the method described with reference to FIGS. 2 and 3, so is not described again here.

Figure 5:
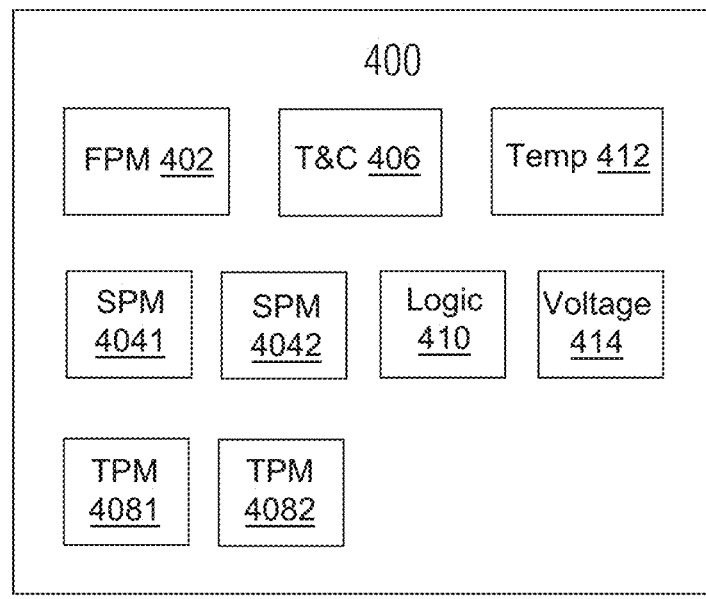
FIG. 5 is a block diagram of a device for monitoring an RF transmission circuit of an MRI apparatus according to an exemplary embodiment of the present disclosure.

FIG. 5 is a block diagram of a device for monitoring an RF transmission circuit of an MRI apparatus according to an exemplary embodiment of the present disclosure. The device for monitoring an RF transmission circuit of an MRI apparatus according to an exemplary embodiment of the present disclosure comprises all of the components of the device shown in FIG. 4. For a description of these components, see the embodiment above; they will not be described again here.

In addition, referring to FIG. 5, the device 400 for monitoring an RF transmission circuit of an MRI apparatus according to an exemplary embodiment of the present disclosure further comprises:

two third power measurement modules (third power measurement sensors) 4081 and 4082, each measuring a value of a voltage of one second RF signal at itself and outputting a third power measurement signal, wherein the third power measurement module 4081 is further connected between an output end of the second power measurement module 4041 and the RF transmit coil, and the third power measurement module 4082 is further connected between an output end of the second power measurement module 4042 and the RF transmit coil. The transmitting and calculating module is further configured to: acquire the two third power measurement signals, and compare the second power measurement signal and the third power measurement signal for the second RF signal that is on the same transmission link and outputted from the bridge; if a voltage value of the third power measurement signal is the same as the voltage value of the second power measurement signal, determine that the RF transmission circuit is normal, and if the voltage value of the third power measurement signal is not the same as the voltage value of the second power measurement signal, determine that the RF transmission circuit is abnormal.

A logic determining module 410 is connected to two mode switching switches of the RF transmission circuit; each mode switching switch is further connected between one output end of the bridge and an input end of one second power measurement module, and is in an ON state or OFF state according to a switch instruction received from the transmitting and calculating module. The logic determining module is configured to: acquire a switch state indication signal, the switch state indication signal being a logic level signal and indicating whether the mode switching switch is in the ON state or OFF state, determine that the mode switching switch is operating normally if the states indicated by the acquired switch state indication signal and the switch instruction are the same, and determine that the mode switching switch is operating abnormally if the states indicated by the acquired switch state indication signal and the switch instruction are not the same.

A temperature sensor 412 measures temperature at a specific position in the RF transmission circuit. The logic determining module is further configured to: acquire a temperature detection signal, the temperature detection signal being a logic level signal and indicating whether a temperature value measured by the temperature sensor exceeds a preset temperature threshold; if the acquired temperature detection signal indicates that the preset temperature threshold is not exceeded, then it is determined that the temperature at the specific position is normal, and if the acquired temperature detection signal indicates that the preset temperature threshold is exceeded, then it is determined that the temperature at the specific position is abnormal.

A voltage sensor 414 measures a power supply voltage of the RF transmission circuit. The logic determining module is further configured to: acquire a voltage detection signal, the voltage detection signal being a logic level signal and indicating whether the power supply voltage of the RF transmission circuit measured by the voltage sensor exceeds a preset voltage threshold; if the acquired voltage detection signal indicates that the preset voltage threshold is not exceeded, then it is determined that the power supply voltage of the RF transmission circuit is normal, and if the acquired voltage detection signal indicates that the preset voltage threshold is exceeded, then it is determined that the power supply voltage of the RF transmission circuit is abnormal.

In this embodiment, the logic determining module 410 is further configured to: acquire a state feedback signal, the state feedback signal being a logic level signal and indicating whether a tuned positive current or reverse voltage supplied to the RF transmit coil by a tuning/detuning dynamic controller of the RF transmission circuit is within a designated threshold range, wherein the tuning/detuning dynamic controller tunes the positive current or reverse voltage supplied to the RF transmit coil according to a control signal received from the transmitting and calculating module 406; if the acquired state feedback signal indicates that the tuned positive current or reverse voltage supplied by the tuning/detuning dynamic controller is within the designated threshold range, then it is determined that the tuning/detuning dynamic controller is operating normally, and if the acquired state feedback signal indicates that the tuned positive current or reverse voltage supplied by the tuning/detuning dynamic controller is not within the designated threshold range, then it is determined that the tuning/detuning dynamic controller is operating abnormally. In an exemplary embodiment, the device 400 (and/or one or more components/modules therein) includes processor circuitry that is configured to perform one or more functions/operations of the device 400 and/or respective functions/operations of components/modules comprised therein.

A method realized by the device 400 for monitoring an RF transmission circuit of an MRI apparatus shown in FIG. 5 is the same as the method described with reference to FIGS. 2 and 3, so is not described again here.

In a device 500 for monitoring an RF transmission circuit of an MRI apparatus according to an embodiment of the present disclosure, the first power measurement module 402, the two second power measurement modules 4041 and 4042, the two third power measurement modules 4081 and 4082, the logic determining module 410, the temperature sensor 412 and the voltage sensor 414 may be mounted in an integrated fashion on a single removable circuit board. Preferably, the first power measurement module 402, the two second power measurement modules 4041 and 4042, the two third power measurement modules 4081 and 4082, the logic determining module 410, the temperature sensor 412 and the voltage sensor 414 may be mounted on a single removable circuit board in an integrated fashion with the bridge, the two mode switching switches and the tuning/detuning dynamic controller of the RF transmission circuit.

In this way, the components of the RF transmission circuit are integrated with the components of the device for monitoring the RF transmission circuit, making the structure more compact. Furthermore, in conjunction with fault diagnosis, troubleshooting can be realized in a simple and convenient manner by replacing the removable circuit board directly after fault diagnosis.

Figure 6:
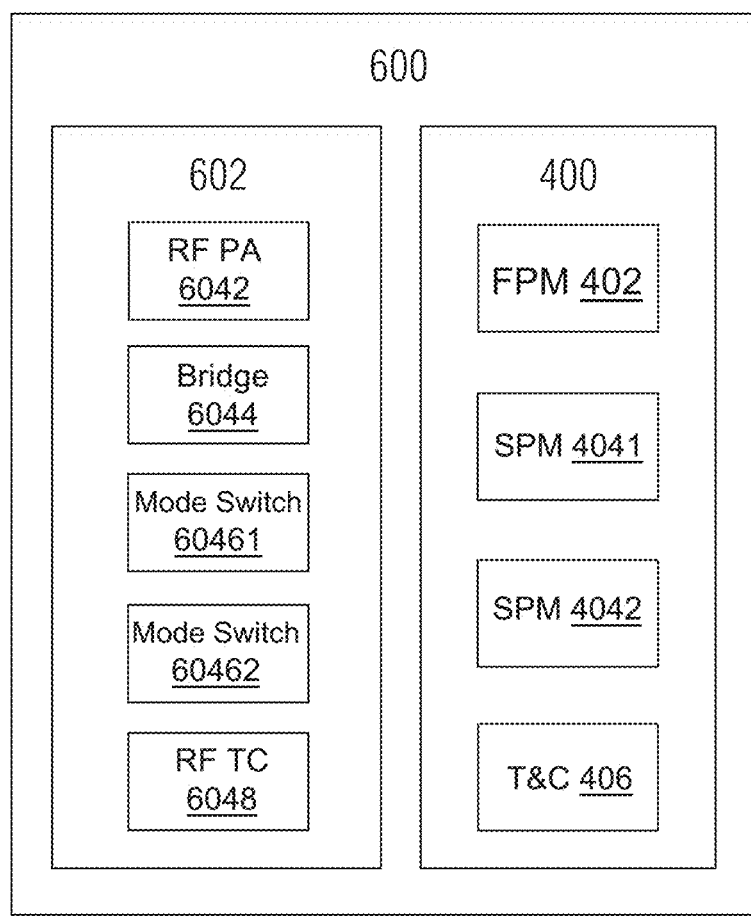
FIG. 6 is a block diagram of an RF transmission device of an MRI apparatus according to an exemplary embodiment of the present disclosure.

According to an embodiment of the present disclosure, an MRI apparatus is further provided. FIG. 6 is a block diagram of an RF transmission device of an MRI apparatus according to an embodiment of the present disclosure. Referring to FIG. 6, an RF transmission device 600 of an MRI apparatus according to an embodiment of the present disclosure comprises: a device 400 for monitoring an RF transmission circuit of an MRI apparatus; and an RF transmission circuit 602, comprising an RF power amplifier 6042, a bridge 6044, two mode switching switches 60461 and 60462, and an RF transmit coil 6048, wherein the bridge 6044 is connected between an output end of the RF power amplifier 6042 and input ends of the two mode switching switches 60461 and 60462, and output ends of the two mode switching switches 60461 and 60462 are separately connected to the RF transmit coil 6048. Two second RF signals generated by the bridge 6044 arrive at the RF transmit coil 6048 via the two mode switching switches 60461 and 60462 respectively. In an exemplary embodiment, the device 600 (and/or one or more components/modules therein) includes processor circuitry that is configured to perform one or more functions/operations of the device 600 and/or respective functions/operations of components/modules comprised therein.

The device 400 for monitoring an RF transmission circuit of an MRI apparatus comprises: a first power measurement module 402 for measuring a voltage of a first RF signal and outputting a first power measurement signal, wherein the first power measurement module 402 is connected between the output end of the RF power amplifier 6042 and an input end of the bridge 6044, the RF power amplifier 6042 is configured to provide the first RF signal, and the bridge 6044 is configured to generate, on the basis of the first RF signal, two second RF signals for transmission via the RF transmit coil 6048 of the RF transmission circuit; two second power measurement modules 4041 and 4042, each measuring a voltage of a corresponding one of the two second RF signals and outputting a second power measurement signal, wherein the two second power measurement modules 4041 and 4042 are respectively connected in two transmission links between the RF transmit coil 6048 and two output ends of the bridge 6044; and a transmitting and calculating module 406, connected to the first power measurement module 402 and the two second power measurement modules 4041 and 4042 and configured to: acquire the first power measurement signal and the two second power measurement signals outputted from the two second power measurement modules 4041 and 4042, perform inverse matrix calculation on the basis of the two second power measurement signals to obtain a voltage calculation value as a calculation result, compare the calculation result with the first power measurement signal, determine that the RF transmission circuit is normal if the difference between the calculation result and a voltage value of the first power measurement signal is within a preset threshold range, and determine that the RF transmission circuit is abnormal if the difference between the calculation result and the voltage value of the first power measurement signal exceeds the preset threshold range.

In this way, when the device for monitoring an RF transmission circuit of an MRI apparatus is applied in an MR apparatus, it is possible to realize real-time linearity calibration of an RF signal characteristic while monitoring the power state of the RF transmission circuit, and also realize RF transmission circuit fault diagnosis and troubleshooting.

A method realized by the device 400 for monitoring an RF transmission circuit of an MRI apparatus in the RF transmission device 600 of an MRI apparatus according to an embodiment of the present disclosure shown in FIG. 6 is the same as the method described with reference to FIGS. 2 and 3, so is not described again here.

Figure 7:
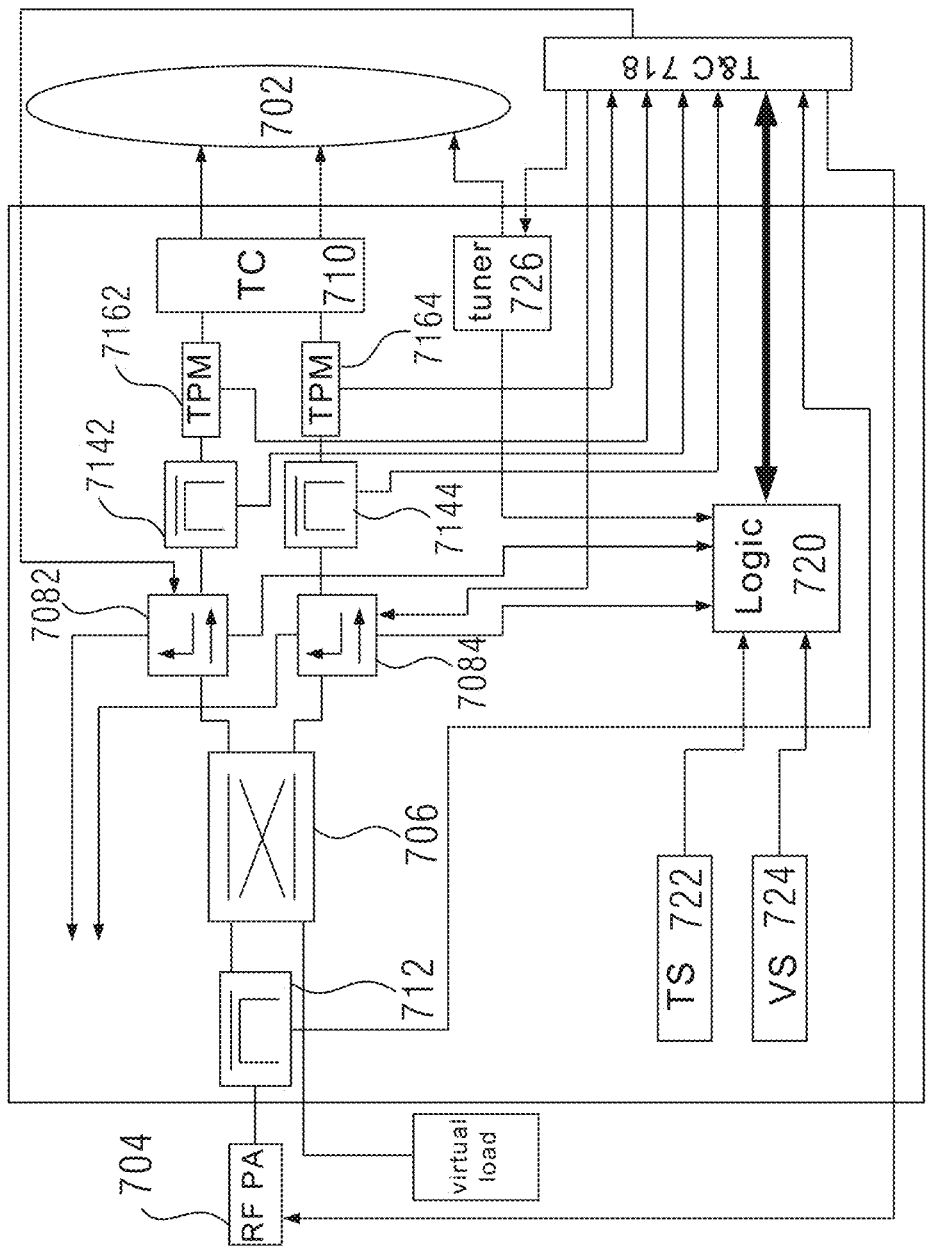
FIG. 7 is a structural schematic diagram of an RF transmission device of an MRI apparatus according to an exemplary embodiment of the present disclosure.

FIG. 7 is a structural schematic diagram of an RF transmission device of an MRI apparatus according to an embodiment of the present disclosure. Referring to FIG. 7, an RF transmission device 700 of an MRI apparatus according to an embodiment of the present disclosure comprises: an RF transmit coil 702 connected to a tuning/detuning dynamic controller 726; an RF transmission circuit, comprising an RF power amplifier 704, a bridge 706, mode switching switches 7082 and 7084 and a tuning capacitor 710; and a device for monitoring an RF transmission circuit of an MRI apparatus, the device comprising: a first power measurement module (first power measurement sensors) 712, two second power measurement modules (second power measurement sensors) 7142 and 7144, third power measurement modules (third power measurement sensors) 7162 and 7164, a transmitting and calculating module 718, a logic determining module 720, a temperature sensor 722 and a voltage sensor 724. The first power measurement module 712 and two second power measurement modules 7142 and 7144 may be identical power measurement modules; moreover, the first power measurement module 712, second power measurement modules 7142 and 7144 and third power measurement modules 7162 and 7164 may be different power measurement modules.

In the embodiment shown in FIG. 7, the first power measurement module 712, the two second power measurement modules 7142 and 7144 and the two third power measurement modules 7162 and 7164 are arranged on an RF transmission path of the RF transmission circuit. The transmitting and calculating module 718 is connected to output ends of the two second power measurement modules 7142 and 7144, output ends of the two third power measurement modules 7162 and 7164, an input end of the RF power amplifier, input ends of the two mode switching switches 7082 and 7084 and an input end of the tuning/detuning dynamic controller 726, and is interconnected with the logic determining module 720.

In the embodiment shown in FIG. 7, in an RF transmission mode, the transmitting and calculating module 718 generates an initial RF signal of fixed frequency and inputs same to the RF power amplifier 704. The RF power amplifier 704 amplifies the initial RF signal and then outputs same as a first RF signal to the first power measurement module 712. The first power measurement module 712 measures the voltage and phase of the first RF signal, and outputs a measurement result as a first power measurement signal to the transmitting and calculating module 718. The first RF signal that has passed through the first power measurement module 712 is then inputted to the bridge. The bridge splits the first RF signal into two second RF signals with orthogonal phases, and outputs these two second RF signals to the mode switching switches 7082 and 7084 respectively. When the mode switching switches 7082 and 7084 are in an ON state, the two second RF signals arrive at the second power measurement modules 7142 and 7144 via the mode switching switches 7082 and 7084 respectively. The second power measurement modules 7142 and 7144 each measure the voltage and phase of one second RF signal, and output measurement results as two second power measurement signals to the transmitting and calculating module 718. The two second RF signals that have passed through the second power measurement modules 7142 and 7144 then enter the third power measurement modules 7162 and 7164. The third power measurement modules 7162 and 7164 each measure the voltage of one second RF signal, and output measurement results as third power measurement signals to the transmitting and calculating module 718. Finally, the two second RF signals that have passed through the third power measurement modules 7162 and 7164 arrive at the RF transmit coil 702 via the tuning capacitor 710 and are transmitted via the RF transmit coil 702, thereby generating an RF magnetic field applied to a patient's body. The tuning capacitor 710 is disposed on the RF transmission path and configured to adjust a resonant frequency of the RF transmit coil 702 to a system center frequency, i.e. an RF signal frequency, e.g. 3 MHz. Furthermore, the tuning/detuning dynamic controller controls the RF transmit coil to be in an RF transmission mode or RF receiving mode, or to be non-operational, according to a control signal received from the transmitting and calculating module 718. In the RF transmission mode, or in an RF receiving mode in which the RF transmit coil acts as a receive coil, the tuning/detuning dynamic controller 726 tunes a positive current supplied to the RF transmit coil; in an RF receiving mode in which the RF transmit coil does not act as a receive coil, the tuning/detuning dynamic controller 726 tunes a reverse voltage supplied to the RF transmit coil.

The transmitting and calculating module 718 receives the two second power measurement signals outputted from the two second power measurement modules 7142 and 7144, and uses voltage values and phase values therein to perform inverse matrix calculation, to obtain a voltage calculation value and a phase calculation value for the first RF signal at the first power measurement module 712. The obtained voltage calculation value for the first RF signal is compared with a voltage measurement value (i.e. a voltage value indicated by the first power measurement signal) in order to determine the power state of the RF transmission circuit. Specifically, when the difference between the voltage measurement value and the voltage calculation value of the first RF signal is within a preset threshold range, it is determined that the RF transmission circuit is normal, and when the difference between the voltage measurement value and the voltage calculation value of the first RF signal exceeds the preset threshold range, it is determined that the RF transmission circuit is abnormal. Furthermore, the transmitting and calculating module 718 uses the voltage values and phase values indicated by the two second power measurement signals to subject the initial RF signal to real-time calibration, and outputs a calibrated initial RF signal to the RF power amplifier to replace the initial RF signal.

The transmitting and calculating module 718 also receives the two third power measurement signals outputted from the third power measurement modules 7162 and 7164, and compares the voltage value indicated by the second power measurement signal and the voltage value indicated by the third power measurement signal for the second RF signal that is on the same transmission link and outputted from the bridge, to further determine whether the power state of the RF transmission circuit is abnormal.

The logic determining module 720 can receive state indication signals continuously fed back by the mode switching switches 7082 and 7084 and the tuning/detuning dynamic controller 726 in order to determine whether their operation is abnormal. The logic determining module 720 can also receive a temperature detection signal and a voltage detection signal fed back by the temperature sensor 722 and the voltage sensor 724, in order to determine whether the temperature at a specific position in the RF transmission circuit and the power supply voltage of the RF transmission circuit are abnormal. Although the temperature sensor 722 and voltage sensor 724 are shown as being single sensors in FIG. 7, they may be provided as multiple sensors as required. The temperature sensor preferably measures the temperature at a position in the RF transmission circuit where heating readily occurs due to high power consumption, e.g. the temperature at the logic determining module 720. The temperature sensor may also be configured to measure the temperature at the tuning/detuning dynamic controller 726, in order to monitor the temperature at this position. The number of voltage sensors is preferably determined according to the number of power supply voltages supplied to the components of the RF transmission circuit; moreover, the value of the power supply voltage supplied may be set to be a preset voltage threshold of the corresponding voltage sensor.

The logic determining module 720 outputs a corresponding determination result to the transmitting and calculating module 718. Thus, the transmitting and calculating module 718 can remotely output a power monitoring abnormality in the RF transmission circuit and a fault diagnosed by the logic determining module 720.

In this way, operating personnel can remotely confirm an abnormality of the RF transmission circuit and confirm whether this is abnormal RF transmission circuit power, abnormal operation of a particular component being monitored, abnormal temperature at a specific position or an abnormal power supply voltage, with no need to perform fault diagnosis at the work site of the MR apparatus.

In the embodiment shown in FIG. 7, multiple components of the MR apparatus 700 may be mounted in an integrated fashion on a single removable circuit board. Specifically, as shown by the solid line box in FIG. 7, the first power measurement module 712, the bridge 706, the mode switching switches 7082 and 7084, the second power measurement modules 7142 and 7144, the third power measurement modules 7162 and 7164, the tuning capacitor 710, the logic determining module 720, the temperature sensor 722, the voltage sensor 724 and the tuning/detuning dynamic controller 726 within the solid line box may be mounted in an integrated fashion on a single removable circuit board.

In an exemplary embodiment, the apparatus 700 (and/or one or more components/modules therein) includes processor circuitry that is configured to perform one or more functions/operations of the apparatus 700 and/or respective functions/operations of components/modules comprised therein.

This not only enables the RF transmission circuit and the monitoring device thereof to have a certain degree of integration for ease of replacement, but also avoids the excessively high replacement cost that would be caused by complete integration. When it is confirmed remotely that a fault exists in the single integrated circuit board, maintenance personnel can be directed to enter the work site of the MR apparatus to replace the single faulty circuit board; thus, maintenance of the MR apparatus is simple and convenient, with a lower cost. Furthermore, when it is necessary to use the MR apparatus for different constant magnetic field strengths (e.g. 1.5 T, 3 T), all that need be done is to replace the single integrated circuit board (the replaced circuit boards have inductance values of mode switching switches and bridges adapted for different magnetic field strengths), thus enabling applications for different magnetic field strengths, with no need for new purchases of MR apparatuses used for different magnetic field strengths.

In the above embodiments of the present disclosure, the description of each embodiment has its own emphasis; for any part that is not described in detail in a particular embodiment, the relevant description of another embodiment can be referred to.

It should be understood that the technical content disclosed in the embodiments provided by the present disclosure can be realized in other ways. The above-described embodiments of the device are merely schematic. For example, the division of units or modules is merely a logic function division, and other manners of division are possible in the actual realization. For example, multiple units or modules or components can be combined or integrated into another system, or some characteristics can be omitted, or not executed. In addition, the shown or discussed couplings, or direct couplings or communication connections between them can be indirect couplings or communication connections, electrical or otherwise, through some interfaces, modules or units.

The unit or module described as a separate component may or may not be physically separated, and the component shown as a unit or module may or may not be a physical unit or module, i.e. may be located at one place, or may be distributed to multiple network units or modules. Some or all of the units or modules may be selected to achieve the object of the solution of this embodiment according to actual requirements.

In addition, each functional unit or module in the various embodiments of the present disclosure may be integrated in one processing unit or module, or each unit or module may physically exist independently, or two or more units or modules may be integrated in one unit or module. The integrated unit or module described above may not only be implemented in the form of hardware, but may also be implemented in the form of a software functional unit or module.

Only preferred embodiments of the present disclosure are described above. It should be pointed out that those skilled in the art could make improvements and modifications without departing from the principle of the present disclosure; such improvements and modifications should also be regarded as being within the scope of protection of the present disclosure.

To enable those skilled in the art to better understand the solution of the present disclosure, the technical solution in the embodiments of the present disclosure is described clearly and completely below in conjunction with the drawings in the embodiments of the present disclosure. Obviously, the embodiments described are only some, not all, of the embodiments of the present disclosure. All other embodiments obtained by those skilled in the art on the basis of the embodiments in the present disclosure without any creative effort should fall within the scope of protection of the present disclosure.

It should be noted that the terms "first", "second", etc. in the description, claims and abovementioned drawings of the present disclosure are used to distinguish between similar objects, but not necessarily used to describe a specific order or sequence. It should be understood that data used in this way can be interchanged as appropriate so that the embodiments of the present disclosure described here can be implemented in an order other than those shown or described here. In addition, the terms "comprise" and "have" and any variants thereof are intended to cover non-exclusive inclusion. For example, a process, method, system, product or equipment comprising a series of steps or modules or units is not necessarily limited to those steps or modules or units which are clearly listed, but may comprise other steps or modules or units which are not clearly listed or are intrinsic to such processes, methods, products or equipment.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general-purpose computer.

For the purposes of this discussion, the term "processor circuitry" shall be understood to be circuit(s), processor(s), logic, or a combination thereof. A circuit includes an analog circuit, a digital circuit, state machine logic, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

The invention claimed is:

1. A method for monitoring a radio frequency (RF) transmission circuit of a magnetic resonance imaging (MRI) apparatus, the method comprising:
    acquiring a first power measurement signal that is indicative of a voltage of a first RF signal, the first RF signal being provided by an RF power amplifier of the RF transmission circuit;
    acquiring two second power measurement signals, each of the two second power measurement signals being indicative of a voltage of a corresponding one of two second RF signals, wherein the two second RF signals are generated based on the first RF signal by a bridge of the RF transmission circuit and configured to be transmitted via an RF transmit coil of the RF transmission circuit;
    performing an inverse matrix calculation, based on the two second power measurement signals, to obtain a voltage calculation value;
    comparing the voltage calculation value with the first power measurement signal; and
    determining an operational state of the RF transmission circuit based on a difference between the voltage calculation value and a voltage value of the first power measurement signal.

2. The method as claimed in claim 1, wherein determining an operational state of the RF transmission circuit comprises:
    determining that the operational state is normal when the difference between the calculation result and the voltage value of the first power measurement signal is within a preset threshold range, and
    determining that the operational state is abnormal when the difference between the calculation result and the voltage value of the first power measurement signal exceeds the preset threshold range.

3. The method as claimed in claim 1, wherein the first RF signal is obtained through amplification of an initial RF signal by the RF power amplifier, and the method further comprising:
    subjecting the initial RF signal to linearity calibration, using the two second power measurement signals, to acquire a calibrated initial RF signal, and
    replacing the initial RF signal with the calibrated initial RF signal.

4. The method as claimed in claim 1, further comprising:
    acquiring two third power measurement signals, each of the third power measurement signals indicating a measured value of a voltage of a respective one of the second RF signals; and
    comparing the second power measurement signal and the third power measurement signal for the same second RF signal,
    wherein the determination of the operational state is further based on the comparison of the second power measurement signal and the third power measurement signal for the same second RF signal.

5. The method as claimed in claim 4, wherein the determination of the operational state further comprises:
    determining that the operational state is normal when a voltage value of the third power measurement signal and a voltage value of the second power measurement signal are equal, and
    determining that the operational state is abnormal when the voltage value of the third power measurement signal and the voltage value of the second power measurement signal are not equal.

6. The method as claimed in claim 1, wherein performing the inverse matrix calculation based on the two second power measurement signals comprises:
    acquiring a voltage value and a phase value of each of the two second power measurement signals, and
    performing the inverse matrix calculation based on the voltage values and phase values acquired from the two second power measurement signals.

7. The method as claimed in claim 1, further comprising:
    acquiring a switch state indication signal, the switch state indication signal being a logic level signal that is indicative of whether a mode switching switch of the RF transmission circuit is in an ON state or an OFF state, wherein the mode switching switch is in the ON state or OFF state according to a received switch instruction;

determining that the mode switching switch is operating normally when the states indicated by the acquired switch state indication signal and the switch instruction are the same, and determining that the mode switching switch is operating abnormally when the states indicated by the acquired switch state indication signal and the switch instruction are not the same.

8. The method as claimed in claim 1, further comprising:

acquiring a state feedback signal, the state feedback signal being a logic level signal that is indicative of whether a tuned positive current or reverse voltage supplied to an RF transmit coil by a tuning controller of the RF transmission circuit is within a designated threshold range, wherein the tuning controller is configured to tune the positive current or reverse voltage supplied to the RF transmit coil according to a received control signal;

determining that the tuning controller is operating normally when the acquired state feedback signal indicates that the tuned positive current or reverse voltage supplied by the tuning controller is within the designated threshold range, and determining that the tuning controller is operating abnormally when the acquired state feedback signal indicates that the tuned positive current or reverse voltage supplied by the tuning controller exceeds the designated threshold range.

9. The method as claimed in claim 1, further comprising:

acquiring a temperature detection signal, the temperature detection signal being a logic level signal that is indicative of whether a temperature value at a specific position in the RF transmission circuit exceeds a preset temperature threshold;

determining that a temperature at the specific position is normal when the acquired temperature detection signal indicates that the preset temperature threshold is not exceeded; and determining that the temperature at the specific position is abnormal when the acquired temperature detection signal indicates that the preset temperature threshold is exceeded.

10. The method as claimed in claim 1, further comprising:

acquiring a voltage detection signal, the voltage detection signal being a logic level signal indicative of whether a power supply voltage of the RF transmission circuit exceeds a preset voltage threshold;

determining that the power supply voltage of the RF transmission circuit is normal when the acquired voltage detection signal indicates that the preset voltage threshold is not exceeded; and determining that the power supply voltage of the RF transmission circuit is abnormal when the acquired voltage detection signal indicates that the preset voltage threshold is exceeded.

11. A non-transitory computer-readable storage medium with an executable program stored thereon, that when executed, instructs a processor to perform the method of claim 1.

12. A device for monitoring a radio frequency (RF) transmission circuit of a magnetic resonance imaging (MRI) apparatus, the device comprising:

a first power measurement sensor configured to measure a voltage of a first RF signal and output a first power measurement signal corresponding to the measured voltage of the first RF signal, wherein the first power measurement sensor is connected between an output end of an RF power amplifier of the RF transmission circuit and an input end of a bridge of the RF transmission circuit, the RF power amplifier being configured to provide the first RF signal, and the bridge being configured to generate, based on the first RF signal, two second RF signals for transmission via an RF transmit coil of the RF transmission circuit;

two second power measurement sensors each configured to measure a voltage of a corresponding one of the two second RF signals and output a respective second power measurement signal based on the measured voltages of the two second RF signals, wherein the two second power measurement sensors are respectively connected in two transmission links between the RF transmit coil and two output ends of the bridge; and a processor connected to the first power measurement sensor and the two second power measurement sensors, and configured to:

acquire the first power measurement signal and the two second power measurement signals outputted from the two second power measurement sensors;

perform inverse matrix calculation, based on the two second power measurement signals, to obtain a voltage calculation value;

compare the voltage calculation value with the first power measurement signal; and determine an operational state of the RF transmission circuit based on a difference between the voltage calculation value and a voltage value of the first power measurement signal.

13. The device as claimed in claim 12, wherein, to determine the operational state of the RF transmission circuit, the processor is configured to:

determine that the operational state is normal when the difference between the calculation result and a voltage value of the first power measurement signal is within a preset threshold range, and determine that the operational state is abnormal when the difference between the calculation result and the voltage value of the first power measurement signal exceeds the preset threshold range.

14. The device as claimed in claim 12, wherein the first RF signal is obtained through amplification of an initial RF signal by the RF power amplifier, and the processor is further configured to:

subject the initial RF signal to linearity calibration, using the two second power measurement signals, to acquire a calibrated initial RF signal, and replace the initial RF signal with the calibrated initial RF signal.

15. The device as claimed in claim 12, further comprising:

two third power measurement sensors, each of the two third power measurement sensors configured to measure a value of a voltage of a corresponding one of the second RF signals and output a respective third power measurement signal, wherein each of the two third power measurement sensors is further connected between an output end of a corresponding one of the two second power measurement sensors and the RF transmit coil, wherein the processor is further configured to:

acquire the two third power measurement signals;

compare respective ones of the second power measurement signals and the third power measurement signals for a same second RF signal;

determine that the RF transmission circuit is normal when a voltage value of the third power measurement signal and a voltage value of the second power measurement signal are equal; and determine that the RF transmission circuit is abnormal when the voltage value of the third power measurement signal and the voltage value of the second power measurement signal are not equal.

16. The device as claimed in claim 12, wherein performing the inverse matrix calculation based on the two second power measurement signals comprises:

acquiring a voltage value and a phase value of each of the two second power measurement signals, and performing the inverse matrix calculation based on the voltage values and phase values acquired from the two second power measurement signals.

17. The device as claimed in claim 12, further comprising: a logic determining module connected to two mode switching switches of the RF transmission circuit, each of the two mode switching switches being further connected between a corresponding one output end of the bridge and an input end of a corresponding one of the two second power measurement sensors, the logic determining module being in an ON state or OFF state according to a switch instruction received from the processor;

the logic determining module being configured to:

acquire a switch state indication signal, the switch state indication signal being a logic level signal and indicating whether the mode switching switch is in the ON state or OFF state;

determine that the mode switching switch is operating normally when the states indicated by the acquired switch state indication signal and the switch instruction are the same, and determine that the mode switching switch is operating abnormally when the states indicated by the acquired switch state indication signal and the switch instruction are not the same.

18. The device as claimed in claim 17, wherein the logic determining module is further configured to:

acquire a state feedback signal that is a logic level signal indicative of whether a tuned positive current or reverse voltage supplied to the RF transmit coil by a tuning controller of the RF transmission circuit is within a designated threshold range, wherein the tuning controller is configured to tune the positive current or reverse voltage supplied to the RF transmit coil according to a control signal received from the processor;

determine that the tuning controller is operating normally when the acquired state feedback signal indicates that the tuned positive current or reverse voltage supplied by the tuning controller is within the designated threshold range, and determine that the tuning controller is operating abnormally when the acquired state feedback signal indicates that the tuned positive current or reverse voltage supplied by the tuning controller exceeds the designated threshold range.

19. The device as claimed in claim 17, further comprising: a temperature sensor configured to measure a temperature at a specific position in the RF transmission circuit, wherein the logic determining module is further configured to:

acquire a temperature detection signal that is a logic level signal indicative of whether a temperature value at the specific position measured by the temperature sensor exceeds a preset temperature threshold;

determine that the temperature at the specific position is normal when the acquired temperature detection signal indicates that the preset temperature threshold is not exceeded, and determine that the temperature at the specific position is abnormal when the acquired temperature detection signal indicates that the preset temperature threshold is exceeded.

20. The device as claimed in claim 17, further comprising: a voltage sensor configured to measure a power supply voltage of the RF transmission circuit, wherein the logic determining module is further configured to:

acquire a voltage detection signal that is a logic level signal indicative of whether a power supply voltage of the RF transmission circuit measured by the voltage sensor exceeds a preset voltage threshold;

determine that the power supply voltage of the RF transmission circuit is normal when the acquired voltage detection signal indicates that the preset voltage threshold is not exceeded, and determine that the power supply voltage of the RF transmission circuit is abnormal when the acquired voltage detection signal indicates that the preset voltage threshold is exceeded.

21. The device as claimed in claim 18, wherein the first power measurement sensor, the bridge, the two mode switching switches, the two second power measurement sensors, the logic determining module and the tuning controller are mounted in an integrated fashion on a single removable circuit board.

22. A radio frequency (RF) transmission device of a magnetic resonance imaging (MRI) apparatus, comprising:

an RF transmission circuit of the MRI apparatus, the RF transmission circuit including: an RF power amplifier, a bridge, two mode switching switches and an RF transmit coil, wherein the bridge is connected between an output end of the RF power amplifier and input ends of the two mode switching switches, and output ends of the two mode switching switches are connected to the RF transmit coil; and a monitoring device configured to monitor the RF transmission circuit, the monitoring device including:

a first power measurement sensor configured to measure a voltage of a first RF signal and output a first power measurement signal corresponding to the measured voltage of the first RF signal, wherein the first power measurement sensor is connected between an output end of an RF power amplifier of the RF transmission circuit and an input end of a bridge of the RF transmission circuit, the RF power amplifier being configured to provide the first RF signal, and the bridge being configured to generate, based on the first RF signal, two second RF signals for transmission via an RF transmit coil of the RF transmission circuit;

two second power measurement sensors each configured to measure a voltage of a corresponding one of the two second RF signals and output a respective second power measurement signal based on the measured voltages of the two second RF signals, wherein the two second power measurement sensors are respectively connected in two transmission links between the RF transmit coil and two output ends of the bridge; and a processor connected to the first power measurement sensor and the two second power measurement sensors, and configured to:
acquire the first power measurement signal and the two second power measurement signals outputted from the two second power measurement sensors;
perform inverse matrix calculation, based on the two second power measurement signals, to obtain a voltage calculation value;
compare the voltage calculation value with the first power measurement signal; and
determine an operational state of the RF transmission circuit based on a difference between the voltage calculation value and a voltage value of the first power measurement signal.

\* \* \* \* \*